(12) United States Patent
Harkness, IV et al.

(10) Patent No.: US 8,029,924 B2
(45) Date of Patent: Oct. 4, 2011

(54) THIN FILM TEMPLATE FOR FABRICATION OF TWO-DIMENSIONAL QUANTUM DOT STRUCTURES

(75) Inventors: Samuel Dacke Harkness, IV, Berkeley, CA (US); Hans Jürgen Richter, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 402 days.

(21) Appl. No.: 12/195,482

(22) Filed: Aug. 21, 2008

(65) Prior Publication Data

US 2010/0047595 A1    Feb. 25, 2010

(51) Int. Cl.
  *G11B 5/65* (2006.01)
  *G11B 5/66* (2006.01)
  *G11B 5/716* (2006.01)

(52) U.S. Cl. .......... 428/831; 428/836.2; 428/840.1; 977/774

(58) Field of Classification Search .......... 428/831, 428/836.2, 840.1; 977/774
See application file for complete search history.

(56) References Cited

U.S. PATENT DOCUMENTS

| | | |
|---|---|---|
| 5,571,612 A | 11/1996 | Motohiro et al. |
| 5,614,435 A | 3/1997 | Petroff et al. |
| 5,888,885 A | 3/1999 | Xie |
| 6,242,326 B1 | 6/2001 | Ro et al. |
| 6,507,042 B1 | 1/2003 | Mukai et al. |
| 6,583,436 B2 | 6/2003 | Petroff et al. |
| 6,596,377 B1 | 7/2003 | Hersee et al. |
| 6,696,313 B2 | 2/2004 | Park et al. |
| 6,709,989 B2 | 3/2004 | Ramdani et al. |
| 6,852,920 B2 | 2/2005 | Sager et al. |
| 7,153,360 B2 | 12/2006 | Herman et al. |
| 7,158,346 B2 * | 1/2007 | Liu et al. ............ 360/131 |
| 7,227,066 B1 | 6/2007 | Roscheisen et al. |
| 7,265,375 B2 | 9/2007 | Zhang et al. |
| 7,294,202 B2 | 11/2007 | Chen et al. |
| 2004/0146560 A1 | 7/2004 | Whiteford et al. |
| 2004/0168626 A1 | 9/2004 | Moeck et al. |
| 2004/0247945 A1 * | 12/2004 | Chen et al. ............ 428/694 TS |
| 2004/0250848 A1 | 12/2004 | Sager et al. |
| 2005/0201963 A1 * | 9/2005 | Dutta ............ 424/70.1 |
| 2006/0003190 A1 * | 1/2006 | Abarra et al. ............ 428/832.1 |
| 2008/0092945 A1 | 4/2008 | Munteanu et al. |
| 2008/0092946 A1 * | 4/2008 | Munteanu et al. ............ 136/252 |

* cited by examiner

*Primary Examiner* — Jennifer C McNeil
*Assistant Examiner* — Jonathan Langman
(74) *Attorney, Agent, or Firm* — Robert P. Lenart, Esq.; Pietragallo Gordon Alfano Bosick & Raspanti, LLP

(57) ABSTRACT

An apparatus includes a first seedlayer including a hexagonal close-packed alloy with a sigma phase addition, and an active layer including a plurality of quantum dots on the first seedlayer. The apparatus can further include a substrate, an adhesion layer on the substrate, and a wetting layer on the adhesion layer, wherein the first seedlayer is on the wetting layer.

13 Claims, 5 Drawing Sheets

THIN FILM TEMPLATE FOR FABRICATION OF TWO-DIMENSIONAL QUANTUM DOT STRUCTURES

BACKGROUND

This invention relates to devices including quantum dot structures, and methods for fabricating such devices.

Quantum dot semiconductors are presently difficult and costly to fabricate using conventional thin film processing techniques. Known solution chemistry methods of synthesizing quantum dots are poor in terms of controlling crystal orientation and are not well-suited for creating dense multicomponent films. Typical vacuum deposition techniques involve careful preparation of strained-layer interfaces between a substrate and film to induce island growth of epilayers and generally require uneconomical methodologies such as molecular beam epitaxy (MBE).

SUMMARY

In one aspect, the invention provides an apparatus comprising a first seedlayer including a hexagonal close-packed alloy with a sigma phase addition and an active layer including a plurality of quantum dots on the first seedlayer. The sigma phase addition can be a body-centered cubic (bcc) element. The apparatus can further include a substrate, an adhesion layer on the substrate, and a wetting layer on the adhesion layer, wherein the first seedlayer is on the wetting layer.

DETAILED DESCRIPTION OF THE INVENTION

In one aspect, this invention provides an apparatus including a structure capable of inducing a desired crystal orientation and morphology in an active layer grown on the structure. The structure includes one or more seedlayers that promote the desired crystal orientation and morphology of quantum dots fabricated directly from sputter or using other known thin film deposition techniques (e.g., physical vapor deposition (PVD), or chemical vapor deposition (CVD)).

Figure 1:
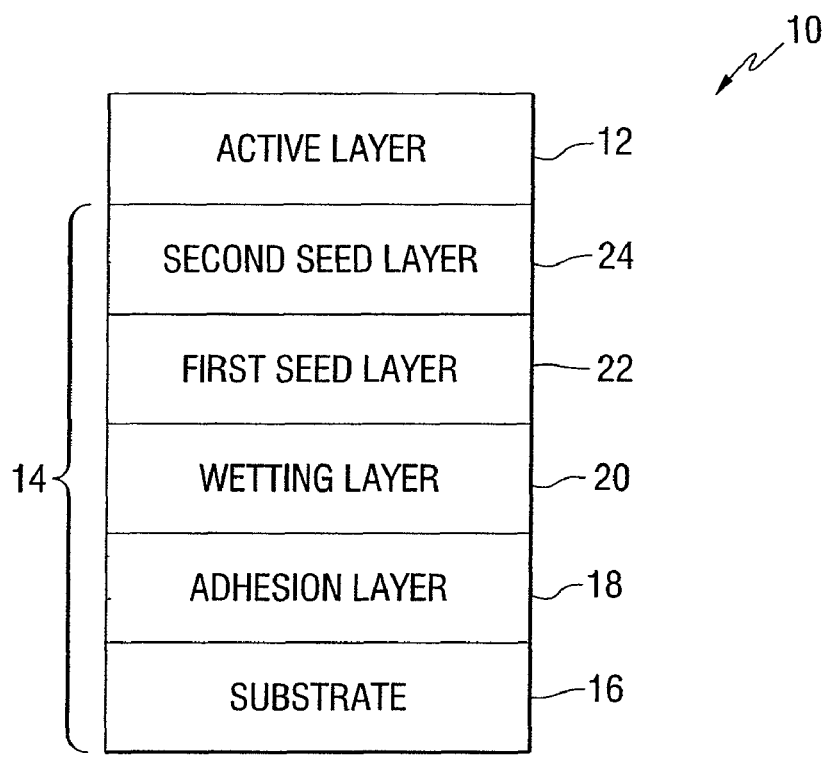
FIG. 1 is a schematic diagram of a multilayer structure, constructed in accordance with an aspect of the invention.

FIG. 1 is a schematic diagram of a multilayer film device 10 constructed in accordance with an aspect of the invention. The device includes an active layer 12 formed on a multilayer structure 14, that induces a desired crystal orientation and morphology in the active layer. In this example, the structure 14 includes a substrate 16; an adhesion layer 18 on the substrate; a wetting layer 20 on the adhesion layer; a first seedlayer 22 on the wetting layer; and a second seedlayer 24 on the first seedlayer. The materials and fabrication of the various layers can be chosen to enable crystallographic and morphological control of top active layer. In one aspect, the active layer includes a plurality of quantum dots of a semiconductor material. In another aspect, the active layer can include grains of ferroelectric or ferromagnetic materials for storage applications, or oxides for optoelectronic applications.

The substrate can be, for example, glass, metal, plastic, polymer, glass-ceramic, or a ceramic material. The adhesion layer can be, for example, Ti, Ta, CrTa, CrTi, CoZr, FeCoB, or other amorphous metals. The wetting layer can be, for example, Ag, Au, Cu, Ti, Al, Co, Ni, Pd, Pt, or alloys of those materials.

Hexagonal close-packed (hcp) elements and their alloys can be used for the seedlayer(s) of the multilayer stack to facilitate the fabrication of semiconductor quantum dots in the active layer. It is found that while other fundamental structures such as body-centered cubic (bcc), face-centered cubic (fcc), tetragonal, etc., may be incorporated as some layers in the final multilayer structure, it is particularly advantageous to have an hcp alloy containing at least one element from the set: Co, Ru, Re, Os, Hf, and Tc, in at least one of the layers beneath the quantum dot layer. The hcp alloy can be immediately beneath the active layer or lower in the stack.

The example of FIG. 1 includes both an adhesion layer and a wetting layer. In other examples, it may be possible to eliminate one or more of the adhesion or wetting layers, or to add other layers. The adhesion layer is important for either Ru, or Re seedlayer materials as well as if Au, Pd, or Pt is used as the wetting layer material. Generally, a precious metal requires an adhesion layer beneath.

Figure 2:
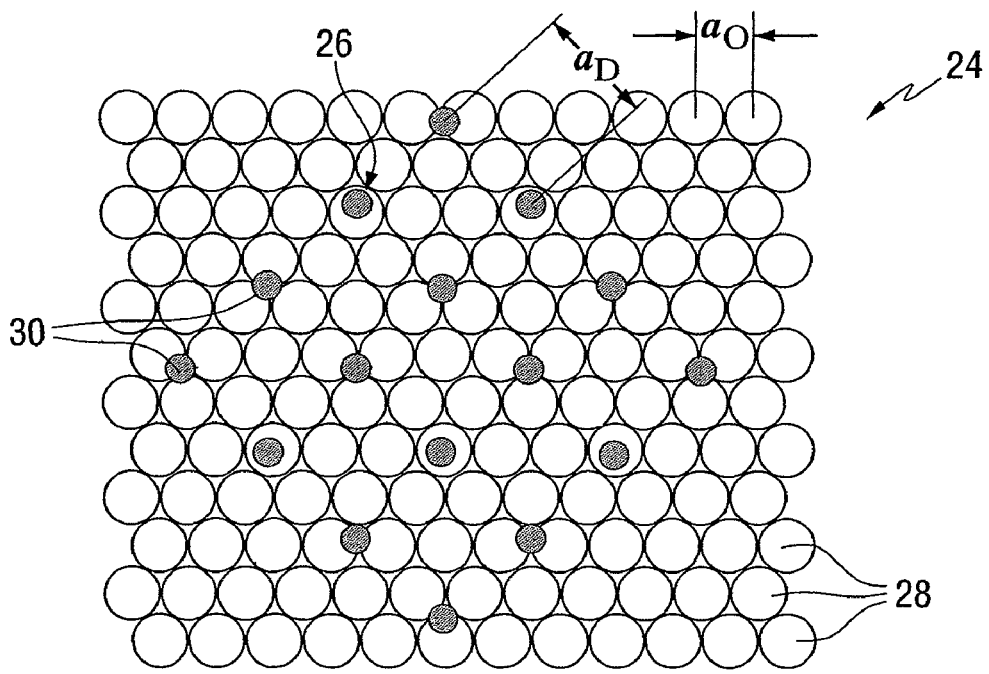
FIG. 2 is a schematic plan view of a lattice showing a seedlayer below a semiconductor layer.

FIG. 2 is a simplified schematic plan view of the second seedlayer lattice 24 below a PbS semiconductor active layer 26. The second seedlayer lattice includes a plurality of atoms 28 and the active layer includes a plurality of atoms 30 that make up a plurality of quantum dots. In FIG. 2, the seedlayer includes an (0001) ReX alloy including Re, and another element labeled as "X". X can be, for example, Cr, Ta, W, Mo, or Nb. Body-centered cubic (bcc) elemental additions that have a sigma phase in the Re—X phase diagram are preferred. Since Re—X are solid solution alloys, atom placement is arbitrary. PbS has the sodium chloride crystal structure; therefore, the atoms shown in the active layer of FIG. 2 are the S ions at the fcc cube-corner positions. For simplicity, other S ions in the center of each square, and Pb ions in the center of each cube direction (e.g., (200), (020), (002)) are not shown.

The active layer includes a plurality of quantum dots of (100) PbS; $\alpha_0$ represents the lattice parameter of the seedlayer, $a_D$ represents the lattice parameter of the active layer, and n is an integer multiple.

For the structure illustrated in FIG. 2, the following design parameters were assumed:

$$n\alpha_0 = \sqrt{2}a_D;$$

$$(n+1)\alpha_0 \cos(30) = \sqrt{2}a_D$$

$$n \approx 5, 7, \ldots$$

where (n+1) is even to place the absorbing atoms at the interstices.

In the above example, ReX is an hcp alloy. Additional elements can be added to the hcp alloy to facilitate control of the resulting lattice parameter and surface energy. Lattice parameter control enables matching with the semiconductor layer, which ultimately leads to quantum dots with controlled crystallographic orientation. In one example, an integer multiple of the lattice parameter should approximate a distance equal to the product of the matching semiconductor film lattice parameter and the square root of two. FIG. 2 shows an arrangement of atoms in such a relationship.

FIG. 2 shows the quasi-epitaxial arrangement of PbS on ReX. The seedlayer is continuous. The active layer is a plurality of grains in a matrix of oxide material.

Figure 3:
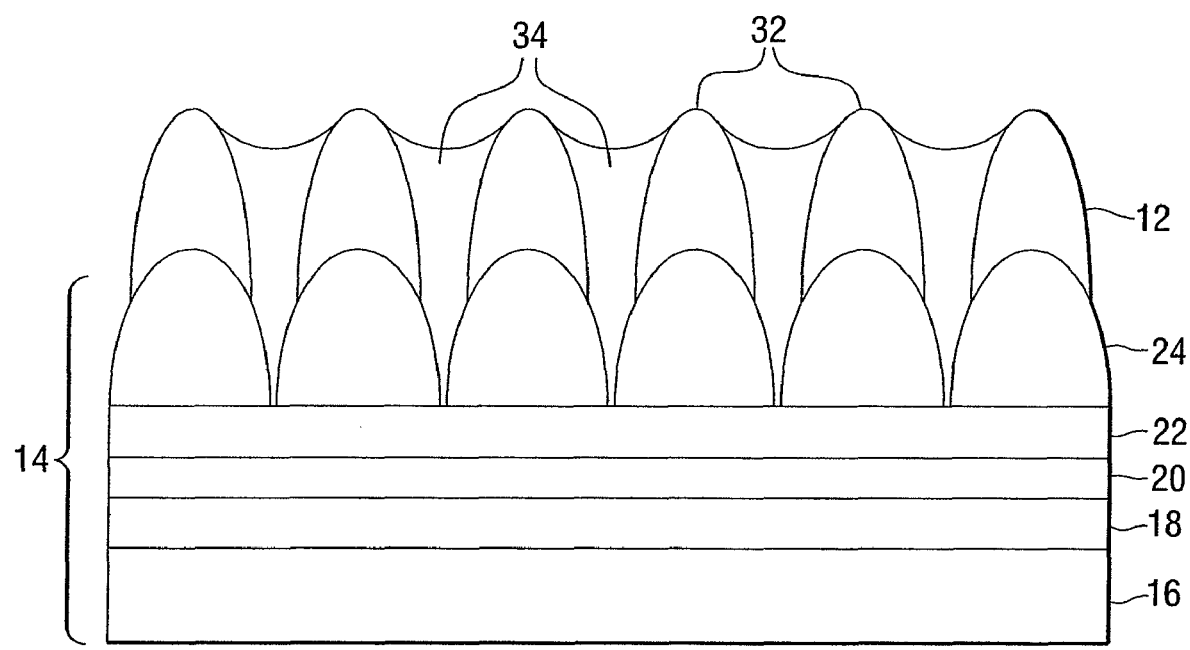
FIG. 3 is another schematic representation of a multilayer structure, constructed in accordance with an aspect of the invention.

The surface energy of the hcp seedlayer provides a control mechanism for how much each grain is domed at the top surface of the seedlayer. For example, where the active layer includes a semiconductive material and an oxide, this doming enables phase separation of co-deposited oxide during the semiconductor layer formation, such that the oxide is collected primarily at the grain boundary. FIG. 3 is a schematic diagram of a multilayer film device 10 constructed in accordance with an aspect of the invention. The device includes an active layer 12 formed on a multilayer structure 14, that induces a desired crystal orientation and morphology in the active layer. The active layer includes a plurality of quantum dots 32 and an oxide 34 between the quantum dots. In this example, the structure 14 includes a substrate 16; an adhesion layer 18 on the substrate; a wetting layer 20 on the adhesion layer; a first seedlayer 22 on the wetting layer; and a second seedlayer 24 on the first seedlayer. The seedlayer 24 has a "hillock structure" that provides the template for the quantum dots to grow.

The higher the surface energy, the more likely oxide is to be captured at the grain boundary, especially at the onset of the semiconductor-oxide growth where separation is most difficult. However, when the surface energy gets too high, the film tends toward being amorphous or nano-crystalline, resulting in limited control of the crystal orientation.

Figure 4:
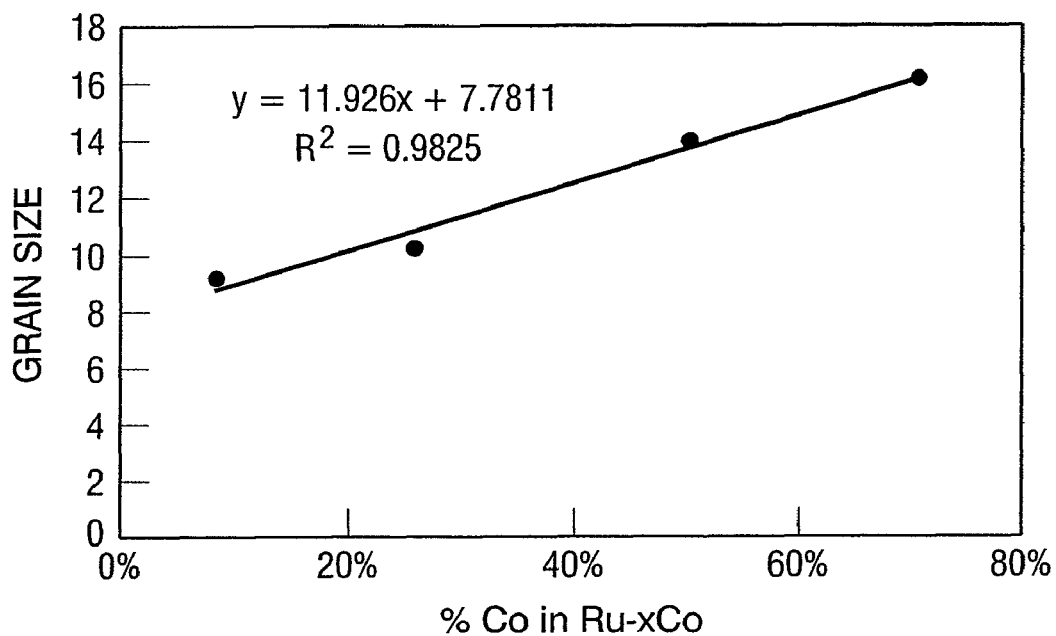
FIG. 4 is a graph of grain size as a function of increasing cobalt content in an Ru—Co alloy.

The surface energy controls the seedlayer grain size, and hence, the quantum dot size. FIG. 4 is a graph of grain size as a function of increasing cobalt content in Ru—Co alloy. Grain size increases with decreasing melting temperature and surface energy. Thus, FIG. 4 shows the response of grain size to decreasing melting temperature and surface energy through adjustment of the cobalt concentration in a Ru—Co alloy. FIG. 4 demonstrates that decreasing surface energy in a 100% solid solution alloy system (e.g., Ru—Co, Re—Ru, or Re—Co) causes the predicted coarsening of grain size. It illustrates the effect of surface energy on grain nucleation and growth. In FIG. 4, 'y' is the grain size, and $R^2$ is a well known statistical parameter measuring the fidelity of observed data to the modeled linear trend. Decreasing [Co] in Ru causes increased melting point temperature ($T_{mp}$) and surface energy ($\gamma$).

An unexpected finding was discovered when researching Cr alloy additions to both Ru and Re: Cr in the seedlayer causes the surface energy to decrease and therefore, the resultant grain size in the active layer to increase, but does not cause significant change to the lattice parameter. This phenomenon allows uni-variant control of grain size, within non-equilibrium solubility limits, without significant perturbation to the lattice parameter.

In addition, hcp alloy solutions (e.g., binary, or tertiary, or multi-component) containing a non-equilibrium 'σ' phase, with the characteristic structure known as $D8_b$ in the list of Strukturbericht designations and in the crystallography space group $P4_2/mnm$, also demonstrated a non-rule-of-mixtures (e.g., Vegard's Law) response of lattice parameter to increasing composition of non-hcp alloy addition. Sigma phase alloy additions may be added to the seedlayer so that the grain size is controlled (up or down) without commensurately affecting the lattice parameter. Most bcc elemental additions to the subset of hcp elements discussed here (e.g., Ru, Re, Os, Tc, and Hf) will cause a decrease in the surface energy of the resultant alloy but do not change the lattice parameter down (from e.g., Re, as would be expected from a straight rule-of-mixtures argument).

Some examples of elements that can be alloyed with Ru, or Re, to yield sigma phases are Cr, Ta, W, Mo, and Nb. In addition, there is a sigma phase in an Re—V system where there is not one evident in the Ru—V system. As used herein, "system" refers to all the alloys and various stoichiometries that can occur between the labeled materials (e.g., the entire phase diagram). "Alloy" refers to a specific amount of one material in another.

When considering which elemental additions to make in pursuit of the above engineering objectives, the designer should be aware of solubility limits which are often found in non-equilibrium positions, as, for instance, is the case for sputtered films.

An observed characteristic of hcp alloys as described above is that they readily orient with the c-axis normal to the plane of the film. Therefore, it is observed that such materials do not require significant, if any, substrate heating to develop the preferred crystallographic texture, (0001).

The low temperature enables columnar growth of narrow grains as is commonly seen in a Thornton diagram. Thornton diagrams show probable grain growth modes for given pressure, temperature regimes. The high pressure, low temperature regime, zone 1, is conducive to the fabrication of oxide segregated semiconductor quantum dots.

Figure 5:
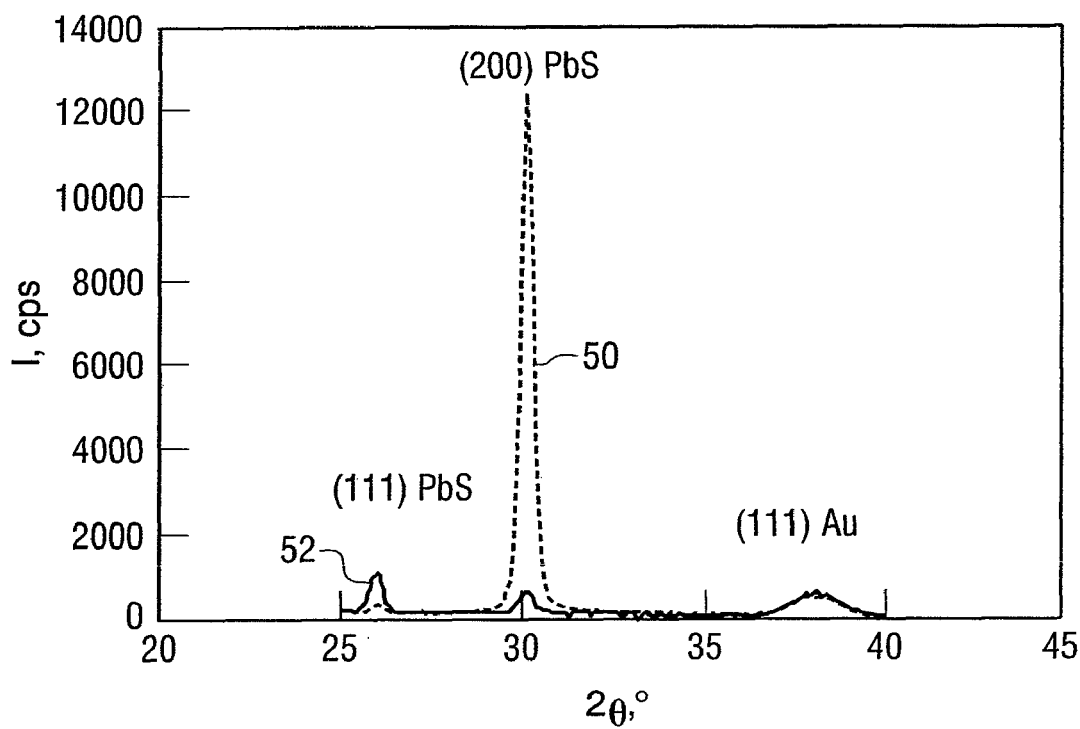
FIG. 5 is an X-ray diffraction (XRD) spectra for 200 nm PbS films grown on top of an Au seedlayer, and on top of amorphous oxide.

Furthermore, it has also been observed that parallel alignment between seedlayer(s) formed according to an aspect of this invention and a semiconductor active layer such as PbS, can be created at similar processing temperatures. FIG. 5 is a graph of X-ray diffraction (XRD) spectra for two 200 nm PbS films. Line 50 is for a 200 nm PbS film grown on top of a 3 nm Ta/6 nm Au seedlayer, formed according to an aspect of the invention, and line 52 is for a 200 nm PbS film grown on top of an amorphous oxide (i.e., 3 nm Ta/6 nm Au/5 nm ITO). In one example, (111) oriented Au induces (001) texture in PbS. It is clearly evident from the spectra of FIG. 5, that the PbS/Au film is oriented with the parallel alignment (001)//(111) whereas the PbS/ITO film is randomly textured.

Given the low temperatures experienced by the substrate during subsequent thin film processing, it is possible to select a substrate type that is suitable for a wide variety of desired applications. Accordingly, there may need to be separate cleaning schemes for each variant, directly prior to thin film deposition.

In the case of organic substrate materials such as plastics and polymers, it may be necessary to perform a dehumidifying treatment that is consistent with paradigms known in the thin film processing realm. These additional steps generally encompass plasma treatments to accelerate and complete the outgassing, as well as the possibility of imposing a thin layer of $Si_3N_4$, or other suitable materials, to further encapsulate the organic substrate; thus inhibiting continued outgassing and therefore promoting adhesion.

In one example, prepared substrates are loaded into a multi-station sputter tool capable of either continuous, batch, or semi-batch processing. A 2 nm thick adhesion layer is first applied wherein the material is Ti, Ta, or an amorphous metal such as CrTa, or CrTi. It is generally advantageous to produce this layer in a low pressure (e.g., 1-5 mTorr Ar, Kr, or Xe) deposition regime to facilitate a smooth finished surface. Next, an initial wetting seedlayer is deposited, having a thickness of for example about 1 nm to about 5 nm, using similar growth conditions as for the adhesion layer. The role of the wetting seedlayer is to condition the growth surface for optimally dense homogeneous nucleation of the seedlayer(s) described above. The wetting layer can be, for example, Cu, Au, Al, or Ag. Suitable alternatives may be found for alloy compositions made of primarily fcc or hcp metals coupled with additions of other fcc or hcp metals, or even bcc elements. All of the deposition steps can be carried out in-situ. Nowhere in this process is the intentional addition of heat.

To construct the seedlayers in the example of FIG. 1, the process can be performed in discrete steps. The first step is to deposit 1-50 mu of a first alloy at relatively low pressure (e.g., 0.1-20 mTorr Ar, or Kr, or Xe, or Ne). In some cases, the addition of trace amounts of water or other reactive gases during processing may be used to facilitate improved grain control (e.g., size and/or orientation). Next, 1-50 nm of a second alloy is deposited at relatively high pressure (e.g., 20-200 mTorr Ar, or Kr, or Xe, or Ne, with appropriate partials of other desired gases). The deposition rate for both steps can be selected by interpreting performance at a given pressure selection, but is generally insensitive below 100 Å/s.

The first alloy can be chosen such that the alloy additions to either Co, Ru, Re, Os, Hf, Tc or mixtures thereof, yields a desired grain size. As used herein, "alloy additions" refers to the added material that form a predictable solution composition.

Also, the first alloy should have a lattice mismatch that is small with respect to the second alloy and the subsequently deposited semiconductor active layer (e.g., <7% with the second alloy, and <10% with the product of the quantum dot layer (i.e., the semiconductor layer) lattice parameter and the square root of 2). In one example, the first alloy is Ru—Co—Cr. For the second alloy, the final lattice parameter multiplied by 3 should be less than a 7% mismatch with the product of the quantum dot layer (i.e., the semiconductor layer) lattice parameter and the square root of 2. However, the material chosen for the second alloy should also have a surface energy in the range of about 2 $J/m^2$ to about 3 $J/m^2$. In one example, the second alloy is Re—Co—Cr.

Figure 6:
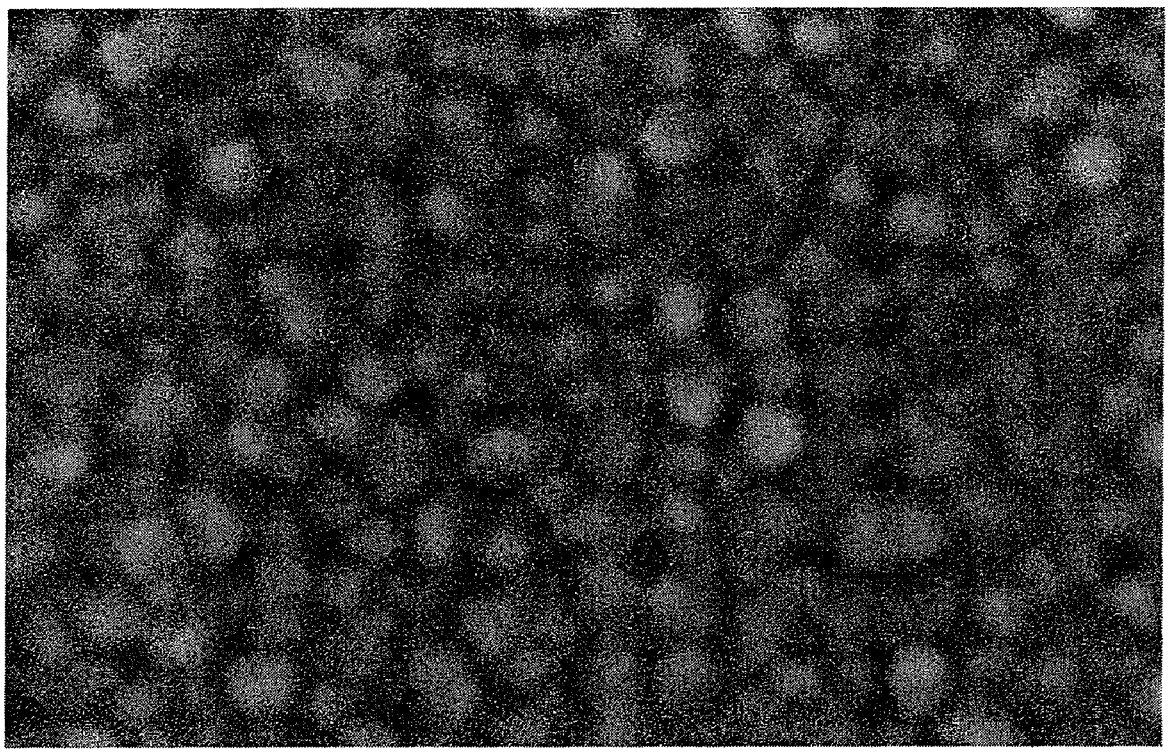
FIG. 6 is a plan view scanning electron microscope (SEM) micrograph of a PbS/$TiO_2$ film grown on an RuCo seedlayer.

The methodology described above can be employed to tailor the seedlayer according to the active layer to be applied to it. In one example, the seedlayer system is capable of inducing texture and morphological control in PbS films leading to a two-dimensional array of PbS quantum dots with the envisaged application being photovoltaic devices. FIG. 6 is a plan view SEM micrograph of PbS/$TiO_2$ film grown on RuCo seedlayer.

In the case of quantum dot sensitization of $TiO_2$ for photovoltaic applications, it is advantageous to position the dots in direct contact with the $TiO_2$ to ensure maximum opportunity for exciton injection. In photovoltaic applications, the term "sensitization" refers to the process by which one material injects newly created photocarriers (e.g., electrons) into the previously insulating material (oxide) wherein they can be conducted away and separated from the opposite type carrier (e.g., holes).

In this embodiment, the quantum dots are used to absorb photons as in a photovoltaic cell and convert them to charge that can be separated through injection of electrons into the neighboring wide bandgap oxide. Such a layer could conceivably also be used in light emitting diode applications where one would charge the quantum dots and allow them to emit light at a frequency governed by the dot size (i.e., the grain size). Such an application would necessitate tighter monodispersity in terms of the grain size distribution.

Figure 7:
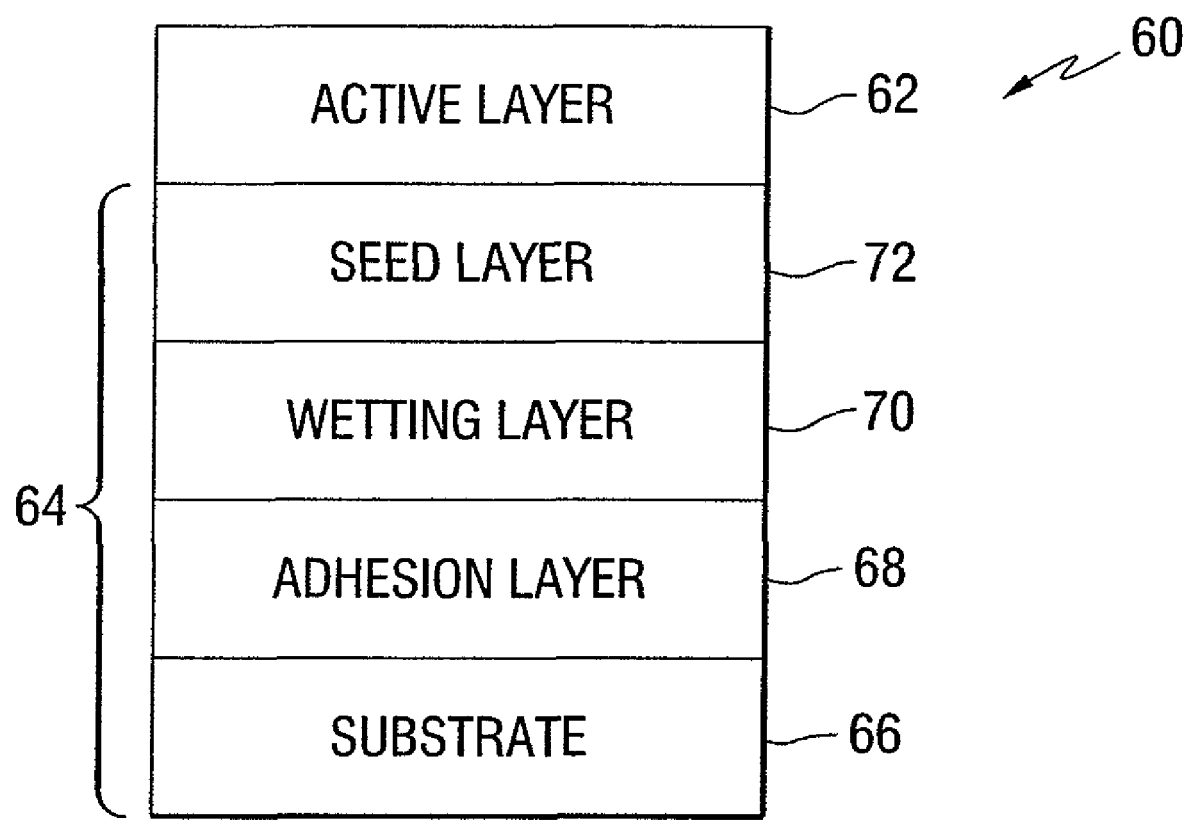
FIG. 7 is a schematic diagram of a multilayer structure, constructed in accordance with another aspect of the invention.

While FIG. 1 shows an example with two seedlayers, in other examples, a single seedlayer can be fabricated using a process wherein the critical process metrics were changed gradually within one continuous step. FIG. 7 is a schematic diagram of a multilayer film device 60 constructed in accordance with an aspect of the invention. The device includes an active layer 62 formed on a multilayer structure 64, that induces a desired crystal orientation and morphology in the active layer. In this example, the structure 64 includes a substrate 66; an adhesion layer 68 on the substrate; a wetting layer 70 on the adhesion layer; and a seedlayer 72 on the wetting layer. The materials and fabrication of the various layers can be chosen as described for the example of FIG. 1, to enable crystallographic and morphological control of the top active layer. In one aspect, the active layer includes a plurality of quantum dots of a semiconductor material. In another aspect, the active layer can include grains of ferroelectric or ferromagnetic materials for storage applications, or oxides for optoelectronic applications.

The substrate can be, for example, glass, metal, plastic, polymer, glass-ceramic, or a ceramic material. The adhesion layer can be, for example, Cr, Ti, Ta, CrTa, CrTi, CoZr, FeCoB, or other amorphous metals. The wetting layer can be, for example, Ag, Au, Cu, Ti, Al, Co, Ni, Pd, Pt, or alloys of those materials.

In a single seedlayer example, the nucleation portion of the single seedlayer would be grown at a low pressure (<10 mTorr) and a low deposition rate (<5 nm/s). Once the growing surface becomes uni-oriented, in terms of crystal orientation (0001), the process can be migrated toward the high pressure Thornton Zone 1 process capable of producing the structures described above.

Hexagonal close-packed (hcp) elements and their alloys can be used for the seedlayer(s) of a multilayer stack to facilitate the fabrication of semiconductor quantum dots in the active layer. It is found that while other fundamental structures such as body-centered cubic (bcc), face-centered cubic (fcc), tetragonal, etc., may be incorporated as some layers in the final multilayer structure, it is particularly advantageous to have an hcp alloy containing at least one element from the set (Co, Ru, Hf, Re, Os, Tc) in at least one of the layers beneath the quantum dot layer.

The various examples described above utilize materials designed to fall within engineered limits of lattice parameter, crystal structure, and surface energy. While the invention has been described in terms of several examples, it will be apparent to those skilled in the art that various changes can be made to the disclosed examples, without departing from the scope of the invention as set forth in the following claims. The implementations described above and other implementations are within the scope of the following claims.

What is claimed is:

1. An apparatus comprising:
   a first seedlayer including a hexagonal close-packed alloy with a sigma phase addition;
   an active layer including a plurality of quantum dots on the first seedlayer; and
   a second seedlayer adjacent to the first seedlayer, wherein the second seedlayer is positioned between the first seed layer and the active layer and includes a hexagonal close-packed alloy, wherein the first seedlayer comprises Ru—Co—Cr, and the second seedlayer comprises Re—Co—Cr.

2. The apparatus of claim 1, wherein a lattice mismatch between the first seedlayer and the second seedlayer is less than 10%.

3. The apparatus of claim 1, wherein the quantum dots comprise:
   a semiconductive material.

4. The apparatus of claim 3, wherein the semiconductive material comprises: PbS.

5. The apparatus of claim 1, wherein the hexagonal close-packed alloy of the first seedlayer has a surface energy in the range of about 2 J/m$^2$ to about 3 J/m$^2$.

6. The apparatus of claim 1, further comprising:
a substrate;
an adhesion layer on the substrate; and
a wetting layer on the adhesion layer, wherein the first seedlayer is on the wetting layer.

7. The apparatus of claim 6, wherein the adhesion layer comprises at least one of:
Cr, Ti, Ta, CrTa, CrTi, CoZr, or FeCoB.

8. The apparatus of claim 6, wherein the wetting layer comprises at least one of:
Ag, Au, Cu, Ti, Al, Co, Ni, Pd, or Pt.

9. The apparatus of claim 1, wherein a lattice mismatch between 3 times the first seedlayer lattice parameter and the product of the active layer lattice parameter and the square root of 2 is less than 10%.

10. The apparatus of claim 1, wherein the quantum dots comprise:
a ferromagnetic material.

11. The apparatus of claim 1, wherein the quantum dots comprise:
a ferroelectric material.

12. The apparatus of claim 1, wherein the first seedlayer has a hillock structure.

13. The apparatus of claim 1, wherein the active layer includes an oxide material between the quantum dots.

* * * * *